(12) United States Patent
Wang et al.

(10) Patent No.: US 11,189,600 B2
(45) Date of Patent: Nov. 30, 2021

(54) METHOD OF FORMING SACRIFICIAL SELF-ALIGNED FEATURES FOR ASSISTING DIE-TO-DIE AND DIE-TO-WAFER DIRECT BONDING

(71) Applicant: Samsung Electronics Co., Ltd., Suwon-si (KR)

(72) Inventors: Wei-E Wang, Austin, TX (US); Mark S. Rodder, Dallas, TX (US); Vassilios Gerousis, Georgetown, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/861,029

(22) Filed: Apr. 28, 2020

(65) Prior Publication Data

US 2021/0183814 A1 Jun. 17, 2021

Related U.S. Application Data

(60) Provisional application No. 62/946,739, filed on Dec. 11, 2019.

(51) Int. Cl.
*H01L 25/065* (2006.01)
*H01L 23/532* (2006.01)
*H01L 23/00* (2006.01)

(52) U.S. Cl.
CPC .......... *H01L 25/0657* (2013.01); *H01L 24/05* (2013.01); *H01L 24/06* (2013.01); *H01L 24/11* (2013.01); *H01L 23/53295* (2013.01)

(58) Field of Classification Search
CPC ..... H01L 25/0657; H01L 24/05; H01L 24/06; H01L 24/11; H01L 23/53295
See application file for complete search history.

(56) References Cited

U.S. PATENT DOCUMENTS 7,872,332 B2  1/2011 Fay et al.
8,784,975 B2  7/2014 Zheng et al.
(Continued)

FOREIGN PATENT DOCUMENTS

WO  2005122706 A2  12/2005

OTHER PUBLICATIONS

Berthier et al., "Stabilization of the tilt motion during capillary self-alignment of rectangular chips," Sensors and Actuators A234, 180-187, 2015.
(Continued)

*Primary Examiner* — Douglas W Owens
(74) *Attorney, Agent, or Firm* — Lewis Roca Rothgerber Christie LLP

(57) ABSTRACT

A method of manufacturing a three-dimensional semiconductor device includes forming a bi-layer sacrificial stack on a top wafer and a bottom wafer each including a series of interconnects in a dielectric substrate. The bi-layer sacrificial stack includes a second sacrificial layer on a first sacrificial layer. The method also includes selectively etching the second sacrificial layers to form a first pattern of projections on the top wafer and a second pattern of projections on the bottom wafer. The first pattern of projections is configured to mesh with the second pattern of projections. The method also includes positioning the top wafer on the bottom wafer and releasing the top wafer such that engagement between the first pattern of projections and the second pattern of projections self-aligns the plurality of interconnects of the top wafer with the plurality of interconnects of the bottom wafer within a misalignment error.

19 Claims, 6 Drawing Sheets

(56) References Cited

U.S. PATENT DOCUMENTS

| | | | |
|---|---|---|---|
| 9,754,893 B2 | 9/2017 | Ding et al. | |
| 9,978,710 B2 | 5/2018 | Dubey et al. | |
| 10,121,875 B1* | 11/2018 | Ho | H01L 21/3086 |
| 10,192,839 B2 | 1/2019 | Arvin et al. | |
| 10,381,330 B2 | 8/2019 | Sato et al. | |
| 2014/0061901 A1 | 3/2014 | Chen et al. | |
| 2020/0135753 A1* | 4/2020 | Zhang | H01L 27/11565 |
| 2021/0111089 A1* | 4/2021 | Liu | H01L 24/82 |
| 2021/0167076 A1* | 6/2021 | Xu | H01L 27/11519 |

OTHER PUBLICATIONS

Loo et al., "Epitaxial CVD Growth of Ultra-Thin Si Passivation Layers on Strained Ge Fin Structures," ECS Journal of Solid State Science and Technology, 7(2): p. 66-p. 72, 2018.

Loo et al., "Processing Technologies for Advanced Ge Devices," ECS Journal of Solid State Science and Technology, 6(1): p. 14-p. 20, 2017.

Berthier et al., "Self-alignment of silicon chips on wafers: A capillary approach," Journal of Applied Physics, vol. 108. 11 pages, 2010.

Kikuta et al., "Al—Ge Reflow Sputtering for Submicron-Contact-Hole Filling," IEEE, 7 pages, 1991.

Lee et al., "Low-pressure, low-temperature hydrogen annealing for nanoscale silicon fin rounding," IEEE Nanotechnology Materials and Devices Conference, 2 pages, 2006.

Panigrahy et al., "Low Temperature Cu—Cu Bonding Technology in Three-Dimensional Integration: An Extensive Review," Journal of Electronic Packaging, vol. 140, 11 pages, Mar. 2018.

Sanchez et al., "Chip to Wafer Direct Bonding Technologies for High Density 3D Integration," IEEE, 5 pages, 2012.

Wang et al., "Ge instability and the growth of Ge epitaxial layers in nanochannels on patterned Si (001) substrates," Journal of Applied Physics, 108, 8 pages, 2010.

* cited by examiner

METHOD OF FORMING SACRIFICIAL SELF-ALIGNED FEATURES FOR ASSISTING DIE-TO-DIE AND DIE-TO-WAFER DIRECT BONDING

CROSS-REFERENCE TO RELATED APPLICATION(S)

The present application claims priority to and the benefit of U.S. Provisional Application No. 62/946,739, filed on Dec. 11, 2019, the entire contents of which are incorporated herein by reference.

BACKGROUND

1. Field

Aspects of the present disclosure relate generally to methods of forming sacrificial features for self-aligning a die to a die or a die to a wafer prior to die-to-die or die-to-wafer bonding.

2. Description of Related Art

Wafer-to-wafer (W2W), die-to-wafer (D2W), and die-to-die (D2D) direct bonding technologies are utilized for manufacturing high-density 3D semiconductor devices. In each of these methods, the high-density 3D semiconductor devices are formed by connecting metal interconnects in the upper die or wafer to metal interconnects in the lower die or wafer.

However, the related art methods of forming the 3D semiconductor devices are prone to creating varying degrees of misalignment between the interconnects. For instance, some related art W2W direct bonding techniques are capable of achieving a misalignment tolerance of approximately 200 nm. In contrast, currently achievable misalignments for D2W and D2D are order(s) of magnitude higher than that achievable by W2W direct bonding techniques. For example, in some related art methods of D2W direct bonding, the misalignment error is approximately 15 μm or greater, and in some related art methods of D2D direct bonding, the misalignment error is approximately 20 μm or greater. Related art D2W and D2D methodologies results in higher misalignment errors compared to W2W methodologies because the misalignment error with related art D2W and D2D methodologies depends solely on the mechanical control capability of a robot placing the upper die on the lower die or wafer.

Various self-alignment methods have been proposed to improve the D2W/D2D misalignment issues, including a water droplet method in which a water droplet with a specific contact angle is formed on the lower die or wafer. In this related art method, the water droplet is configured to (a) help guide the alignment during the placement of the incoming upper die to the lower die or wafer and (b) facilitate the descending of the upper die toward the lower die or wafer during the evaporation of the droplet. However, the related art water droplet method is very sensitive to the hydrophilicity of the lower die or wafer, and it is very challenging to ensure that the water droplets formed on the lower die or substrate have exactly the same shape and size down to μm scale. Moreover, in this related art method, it is challenging to ensure consistent contact between the surface of the incoming die and the water droplet on the lower die or wafer. Furthermore, it is difficult to control the tilt of the incoming die, and therefore the angle of the incoming die relative to the underlying die or wafer, during vaporization of the water droplet. Each of these challenges limits the ability of the water droplet method to reduce the misalignment error between the interconnects of the stacked dies or the stacked die and wafer. Additionally, the related art water droplet method is designed only to align the incoming die to the lower die or wafer vertically (i.e., along the z-axis), not along the x-y directions, and therefore this related art methodology must rely upon robots for alignment in the x-y directions, which results in misalignment errors, as described above.

Related art monolithic three-dimensional integrated circuits (M3DIC) may be able to achieve lower misalignment values than with W2W direct bonding by producing an interconnect density in a range of 50-100 nm. However, related art M3DIC are extremely complex and expensive, and there are no currently known methods qualified to avoid copper cross-contamination during front-end-of-line (FEOL) device formation.

SUMMARY

The present disclosure is directed to various embodiments of a method of manufacturing a three-dimensional semiconductor device. In one embodiment, the method includes forming a bi-layer sacrificial stack on each of a top wafer and a bottom wafer each including a series of interconnects in a dielectric substrate. The bi-layer sacrificial stack includes a first sacrificial layer and a second sacrificial layer on the first sacrificial layer. The method also includes selectively etching the second sacrificial layer on each of the top wafer and the bottom wafer, which forms a first pattern of projections on the top wafer and a second pattern of projections on the bottom wafer. The first pattern of projections is configured to mesh with the second pattern of projections. The method also includes positioning the top wafer on the bottom wafer and releasing the top wafer such that engagement between the first pattern of projections and the second pattern of projections self-aligns the series of interconnects of the top wafer with the series of interconnects of the bottom wafer within a misalignment error, and selectively removing the first and second patterns of projections and the first sacrificial layer. Following the selective removal of the first and second patterns of projections, the series of interconnects of the top wafer are in contact with the series of interconnects of the bottom wafer.

The method may include forming a lubricant layer on at least one of the first pattern of projections and the second pattern of projections.

Each of the first pattern of projections and the second pattern of projections may include a sawtooth pattern of tapered pillars.

The first pattern of projections may define a series of male features, and the second pattern of projections may define a series of female features configured to receive the series of male features.

The misalignment error may be less than approximately 1 um.

The method may include annealing each of the first pattern of projections and the second pattern of projections, which smooths sharp edges of each of the first pattern of projections and the second pattern of projections.

The annealing may be performed with hydrogen or hydrogen plasma at a temperature of approximately 400° C. or less.

The method may include selectively etching the dielectric substrate, which exposes exposed portions of the interconnects.

A height of each of the exposed portions of the interconnects may be in a range from approximately 10 nm to approximately 100 nm.

A material of the series of interconnects may include copper.

A material of the dielectric substrate may include silicon dioxide.

A material of the first sacrificial layer may be silicon oxycarbide (SiCO), silicon nitride ($Si_3N_4$), silicon-oxynitride (SiON), silicon carbide (SiC), silicon carbon nitride (SiCN), silicon carbon oxynitride (SiCON), aluminum (Al), cobalt (Co), and/or a silicon-germanium (SiGe) alloy.

A material of the second sacrificial layer may include germanium or a germanium-aluminum alloy.

A material of the lubricant layer may be amorphous-carbon (aC), graphite, graphene, and/or boron nitride.

A thickness of the second sacrificial layer may be greater than a thickness of the first sacrificial layer.

The thickness of the second sacrificial layer may be in a range from approximately 50 nm to approximately 1,000 nm, and the thickness of the first sacrificial layer may be in a range from approximately 1 nm to approximately 100 nm.

A cross-sectional area of the second sacrificial layer on the top wafer may be substantially equal to a cross-sectional area of the second sacrificial layer on the bottom wafer.

The cross-sectional area of the second sacrificial layer may have a length and a width in a range from approximately 0.1 um×approximately 0.5 um to approximately 0.1 um to approximately 5 um.

In one embodiment, a method of manufacturing a three-dimensional semiconductor device includes forming a bi-layer sacrificial stack on each of a top wafer and a bottom wafer each including a series of interconnects in a dielectric substrate. The bi-layer sacrificial stack includes a first sacrificial layer and a second sacrificial layer on the first sacrificial layer. The method also includes forming a first pattern of projections from the second sacrificial layer on the top wafer and a forming second pattern of projections on the second sacrificial layer on the bottom wafer. The first pattern of projections is configured to mesh with the second pattern of projections. The method also includes forming a lubricant layer on each of the first pattern of projections and the second pattern of projections, positioning the top wafer on the bottom wafer with a robotic device such that the series of interconnects of the top wafer are aligned with the series of interconnects of the bottom wafer within a first alignment error, releasing the top wafer such that engagement between the first pattern of projections and the second pattern of projections self-aligns the series of interconnects of the top wafer with the series of interconnects of the bottom wafer within a second misalignment error less than the first alignment error, and selectively removing the lubricant layer, the first and second patterns of projections, and the first sacrificial layer. Following the selectively removing of the lubricant layer, the first and second patterns of projections, and the first sacrificial layer, the series of interconnects of the top wafer are in contact with the plurality of interconnects of the bottom wafer.

The second alignment error may be less than approximately 1 µm or less than approximately 200 nm.

The present disclosure is also directed to various embodiments of a three-dimensional semiconductor device. In one embodiment, the three-dimensional semiconductor device includes a top wafer having a series of interconnects in a dielectric substrate, a first pattern of projections on the top wafer including at least one sacrificial layer, a bottom wafer including a series of interconnects in a dielectric substrate, and a second pattern of projections on the bottom wafer including at least one sacrificial layer. The first pattern of projections mesh with the second pattern of projections, and the series of interconnects of the top wafer are aligned with the series of interconnects of the bottom wafer within an alignment error of approximately 1 µm or less.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
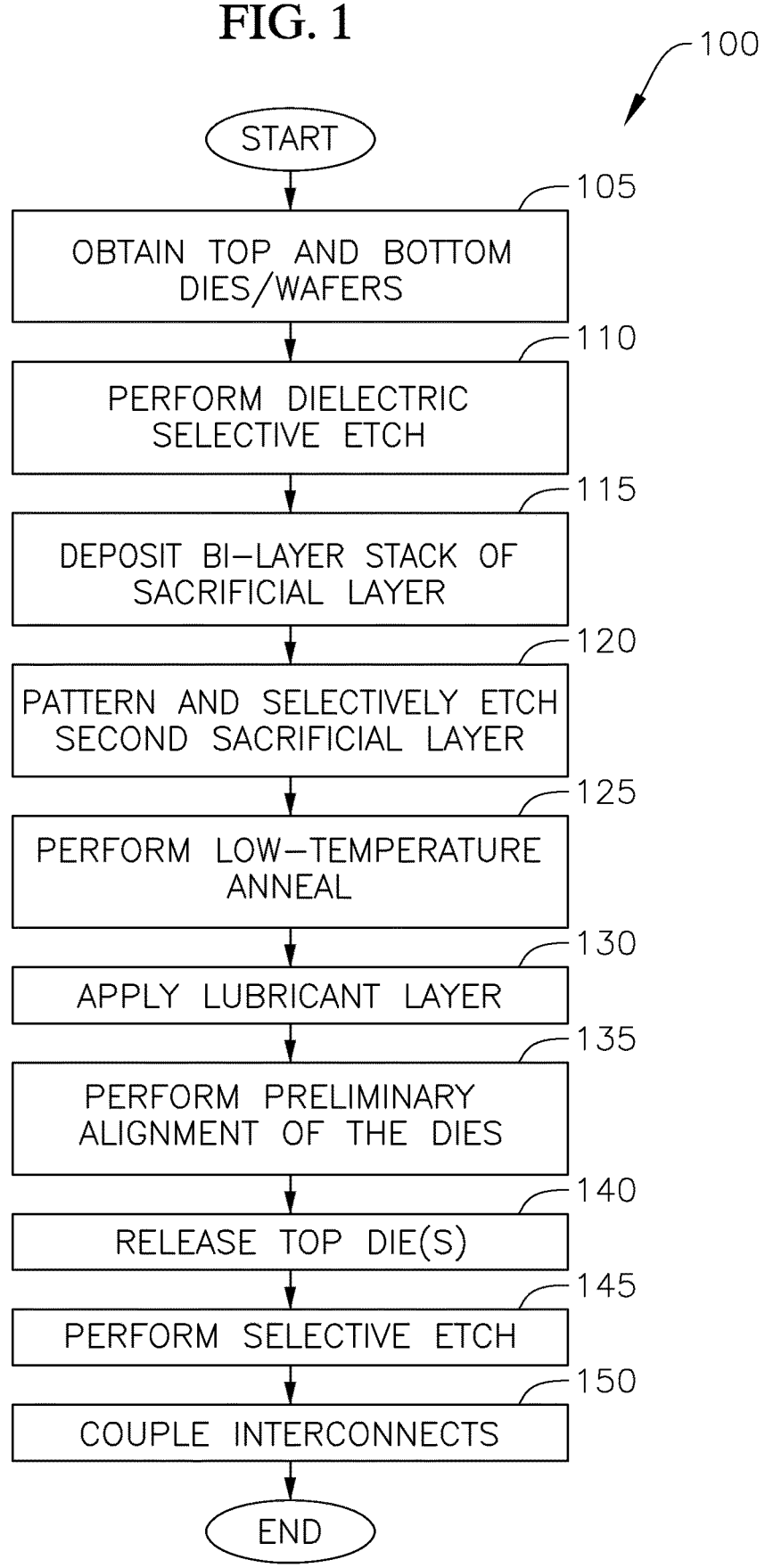
FIG. 1 is a flowchart illustrating tasks of a method of forming sacrificial features for self-aligning a die to another die or a die to a wafer prior to die-to-die or die-to-wafer bonding according to one embodiment of the present disclosure.

The present disclosure relates to various embodiments of a method of bonding a die to a wafer or a die to a die to form a three-dimensional semiconductor device. In one or more embodiments, the method of forming the three-dimensional semiconductor device includes forming sacrificial features on the incoming upper die and the lower die or wafer that are configured to self-align the metal interconnects of the incoming upper die to the metal interconnects of the lower die or wafer with a misalignment error, such as approximately 1 µm (e.g., less than approximately 200 nm). Additionally, in one or more embodiments, these sacrificial features utilized to self-align the metal interconnects may be selectively removed prior to coupling (e.g., direct coupling) the metal interconnects in the upper die to the metal interconnects in the lower die or wafer.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 depicts a flowchart illustrating tasks of a method 100 of bonding an incoming upper die 201 to a lower die or wafer 202 to form a three-dimensional semiconductor device 200 (see FIG. 2I) according to one embodiment of the present disclosure, and FIGS. 2A-2I depict the upper and lower dies 201, 202 (or the upper die 201 and the lower wafer 202) during the method 100 of FIG. 1.

Figure 2A:
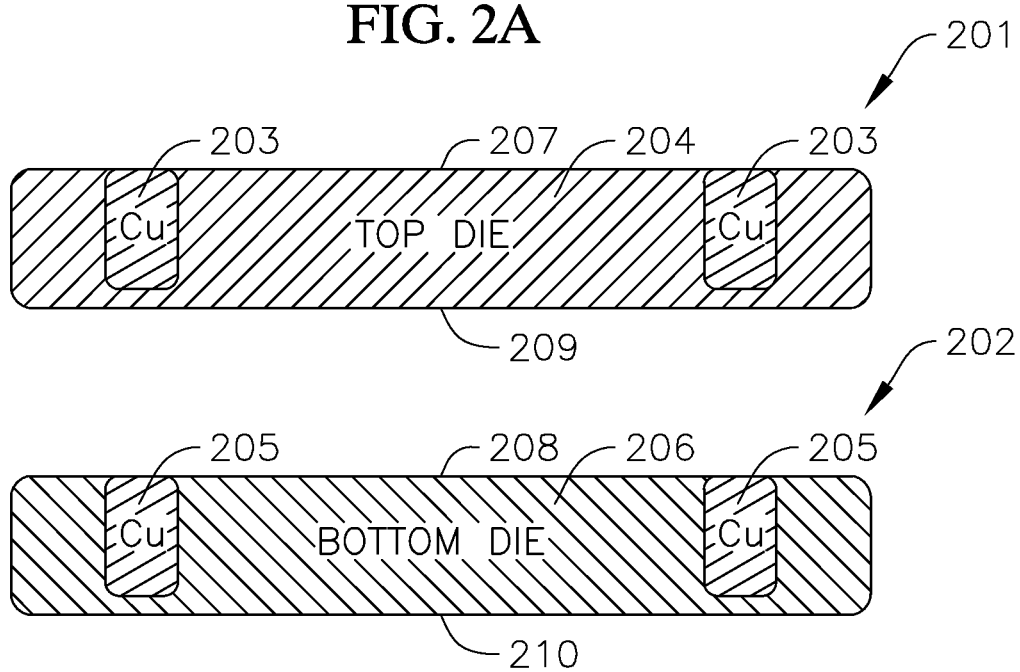
FIGS. 2A-2I depict the formation of sacrificial features on a top wafer and a bottom wafer during the method of FIG. 1 according to one embodiment of the present disclosure.

With reference now to the embodiment illustrated in FIGS. 1 and 2A, the method 100 includes a task 105 of manufacturing or obtaining the top die 201 having a plurality of interconnects 203 in a substrate 204 and manufacturing or obtaining the bottom die or wafer 202 having a plurality of interconnects 205 in a substrate 206. In one or more embodiments, the interconnects 203, 205 of the top and bottom dies/wafers 201, 202 may be formed of any suitable electrically conductive material, such as copper (Cu), and the substrates 204, 206 of the top and bottom dies/wafers 201, 202 may be formed of any suitable dielectric material, such as silicon (Si). In one or more embodiments, the substrates 204, 206 may be a silicon-on-insulator (SOI) or a wafer having a crystalline orientation of (100), (110), or (111). Additionally, in the illustrated embodiment, the top and bottom dies/wafers 201, 202 each include a first surface 207, 208, respectively, and a second surface 209, 210, respectively, opposite the first surface 207, 208, and the thicknesses of the top and bottom dies/wafers 201, 202 are defined in a direction from the first surface 207, 208 to the second surface 209, 210, respectively. In the illustrated embodiment, the interconnects 203, 205 extend through at least a portion of the thickness of the top and bottom dies/wafers 201, 202, respectively.

Figure 2B:
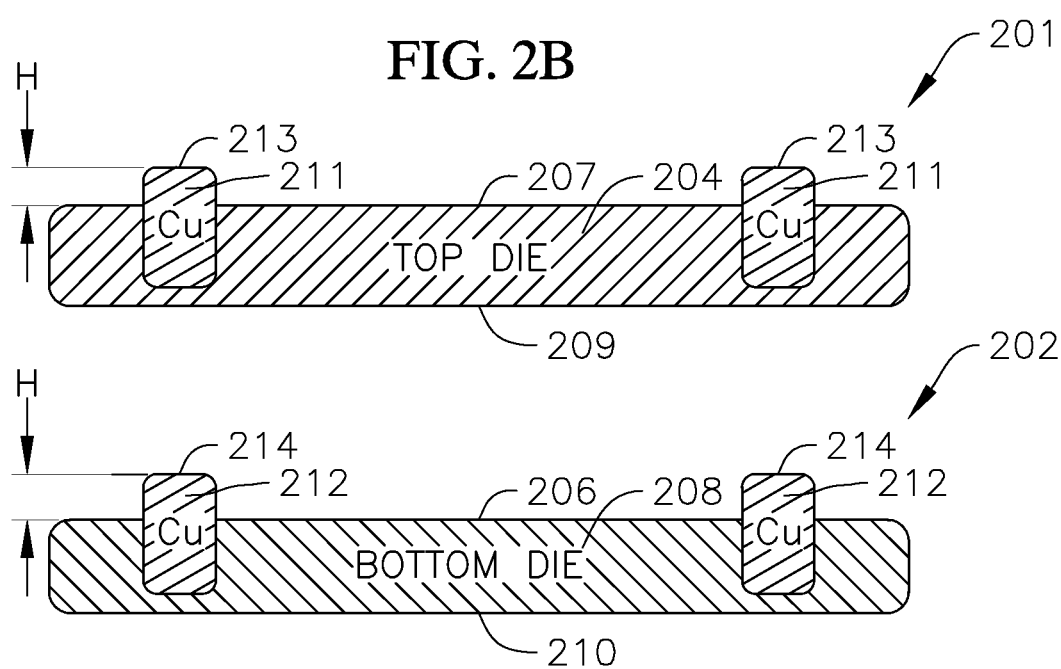

With reference now to the embodiment illustrated in FIGS. 1 and 2B, the method 100 includes a task 110 of performing a dielectric selective etch on the first surfaces 207, 208 of the top and bottom dies/wafers 201, 202. Performing the dielectric selective etch removes dielectric material from the first surfaces 207, 208 of the substrates 204, 206 of the top and bottom dies/wafers 201, 202 such that the thicknesses of the substrates 204, 206 of the top and bottom dies/wafers 201, 202 is reduced and the first surfaces 207, 208 of the top and bottom dies/wafers 201, 202 are narrowed (e.g., thinned) toward the second surfaces 209, 210, respectively. Additionally, in one or more embodiments, performing the dielectric selective etch does not (or substantially does not) remove material from the interconnects 203, 205. Accordingly, following the task 110 of performing the dielectric selective etch, portions 211, 212 of the interconnects 203, 205 extend beyond the first surfaces 207, 208 of the substrates 204, 206 of the top and bottom dies/wafers 201, 202 (e.g., portions 211, 212 of the interconnects 203, 205 are exposed beyond the first surfaces 207, 208 of the dielectric substrates 204, 206 following the task 110 of performing the dielectric selective etch). In one or more embodiments, the height H of the exposed portions 211, 212 of the interconnects 203, 205 following the task 110 of performing the dielectric selective etch is in a range from approximately 10 nm to approximately 100 nm, as defined from an uppermost surface 213, 214 of the interconnects 203, 205 to the first surface 207, 208 of the dielectric substrate 204, 206 of the top and bottom dies/wafers 201, 202. As described in more detail below, the exposed portions 211 of the interconnects 203 of the top die 201 are configured to contact the exposed portions 212 of the interconnects 205 of the bottom die/wafer 202 to create an electrical connection between the top and bottom dies/wafers 201, 202. Additionally, as described in more detail below, the exposed portions 211, 212 of the interconnects 203, 205 are configured to create a space 215 (e.g., a void or an opening) between the top and bottom dies/wafers 201, 202 (see FIG. 2H) that enables complete or substantially complete removal of sacrificial features that are formed and utilized to self-align the top and bottom dies/wafers 201, 202 relative to each other, as described below with reference to a subsequent task of the method 100.

Figure 2C:
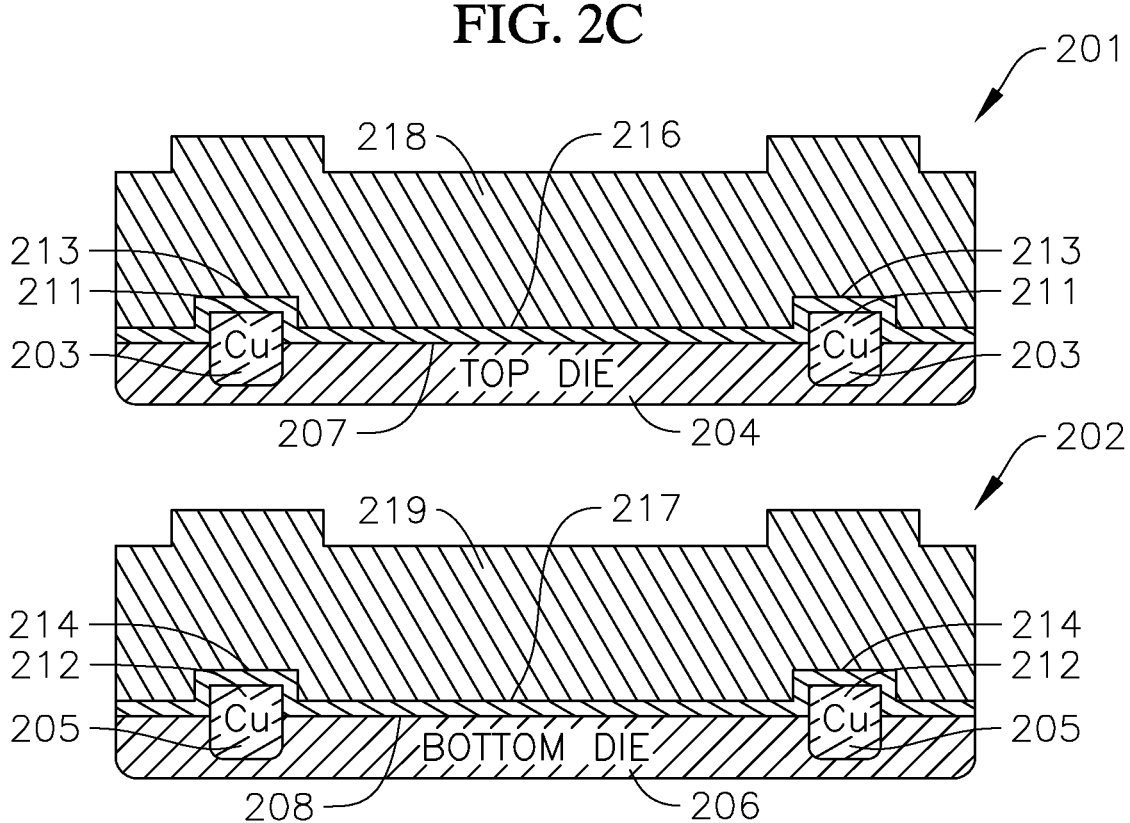

With reference now to the embodiment illustrated in FIGS. 1 and 2C, the method 100 includes a task 115 of depositing a bi-layer stack on the first surfaces of the dielectric substrates 204, 206 and the exposed portions 211, 212 of the interconnects 203, 205 of the top and bottom dies/wafers 201, 202. In one or more embodiments, the task 115 of depositing the bi-layer stack comprises depositing a first sacrificial layer 216, 217 on the first surfaces 207, 208, respectively, of the dielectric substrates 204, 206 and the exposed portions 211, 212 of the interconnects 203, 205 of the top and bottom dies/wafers 201, 202, and depositing a second sacrificial layer 218, 219 on the first sacrificial layer 216, 217, respectively. The first sacrificial layer 216, 217 may be any suitable material that can be selectively etched relative to the dielectric material of the substrates 204, 206 and the material of the interconnects 203, 205. In one or more embodiments, the material of the first sacrificial layer 216, 217 may be, for example, a dielectric such as silicon oxycarbide (SiCO), silicon nitride ($Si_3N_4$), silicon-oxynitride (SiON), silicon carbide (SiC), silicon carbon nitride (SiCN), or silicon carbon oxynitride (SiCON), or a metal, such as aluminum (Al), cobalt (Co), or a low germanium (Ge) content silicon-germanium (SiGe) alloy. In one or more embodiments, the first sacrificial layer 216, 217 may have a thickness in a range from approximately 1 nm to approximately 100 nm. In one or more embodiments, the first sacrificial layer 216, 217 may have a thickness in a range from approximately 1 nm to approximately 20 nm. Additionally, in one or more embodiments, the first sacrificial layer 216, 217 is configured to function as an etch stop during a subsequent task of etching the second sacrificial layer 218, 219, as described in more detail below.

In one or more embodiments, the second sacrificial layer 218, 219 may be any suitable material that is mechanically strong (e.g., having a Young's modulus in a range from approximately 80 GPa to approximately 140 GPa, such as approximately 110 GPa), malleable (e.g., susceptible to shaping in a controlled manner via a hydrogen anneal), and can be selectively etched relative to the material of the first sacrificial layer 216, 217, the dielectric material of the dielectric substrates 204, 206, and the material of the interconnects 203, 205. In one or more embodiments, the material of the second sacrificial layer 218, 219 may comprise Ge or a germanium-aluminum (Ge—Al) alloy. In the illustrated embodiment, the second sacrificial layer 218, 219 is thicker than the first sacrificial layer 216, 217, respectively. In one or more embodiments, the second sacrificial layer 218, 219 may have a thickness in a range from approximately 50 nm to approximately 1,000 nm. In one or more embodiments, the second sacrificial layer 218, 219 may have a thickness in a range from approximately 50 nm to approximately 200 nm. In one or more embodiments, the material and thickness of the first and second sacrificial layers 216, 217, 218, 219 may be the same for both of the top and bottom dies/wafers 201, 202. In one or more embodiments, the material and/or the thicknesses of the first and second sacrificial layers 217, 219 on the bottom die/wafer 202 may be different than the material and/or the thicknesses of the first and second layers 216, 218 on the top dies 201.

Figure 2D:
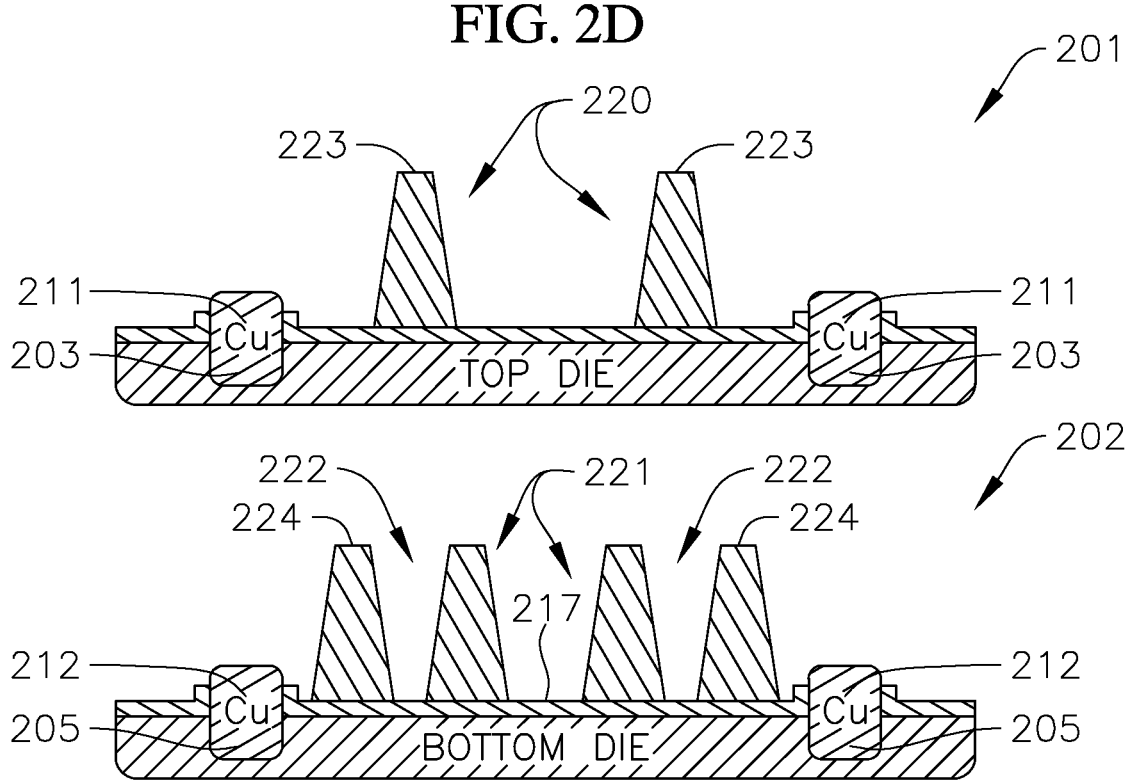

With reference now to the embodiment illustrated in FIGS. 1 and 2D, the method 100 includes a task 120 of patterning and selectively etching the second sacrificial layer 218, 219 of both of the top and bottom dies/wafers 201, 202 to form a first pattern of projections 220 on the top die 201 and a second pattern of projections 221 on the bottom wafer/die 202, which, when engaged with each other (when the patterned surfaces are placed face-to-face), are configured to align the interconnects 203, 205 of the top and bottom dies/wafers 201, 202 (e.g., the engagement between first pattern of projections 220 and the second pattern of projections 221 is configured to align the interconnects 203, 205 of the top and bottom dies/wafers 201, 202 with an alignment error of less than approximately 1 um, such as, for instance, less than approximately 200 nm). In one or more embodiments, the task 120 of etching the second sacrificial layer 218, 219 is selective with respect to the material of the first sacrificial layer 216, 217 such that at least some of the first sacrificial layer 216, 217 remains following the task 120 of selectively etching the second sacrificial layer 218, 219. In one or more embodiments, the first sacrificial layer 216, 217 is not removed or substantially not removed during the task 120 of etching the second sacrificial layer 218, 219. In one or more embodiments, the selectivity of the etch performed in task 120 is greater than approximately 10. In one or more embodiments, the selectivity of the etch performed in task 120 may be greater than approximately 20. As used herein, the term "selectivity" refers to the ratio of the rate at which the surface or layer to be etched is removed to the rate at which the surface or layer not to be etched is removed. For instance, in one or more embodiments, during the task 120, the ratio of the rate at which the second sacrificial layer 218, 219 is etched to the rate at which the first sacrificial layer 216, 217 is etched is greater than approximately 10 (e.g., greater than approximately 20). The task 120 of selectively etching the second sacrificial layer 218, 219 may be performed utilizing any suitable etching technique, such as a wet etch, a dry plasma etch, or an atomic layer etch.

Figure 3:
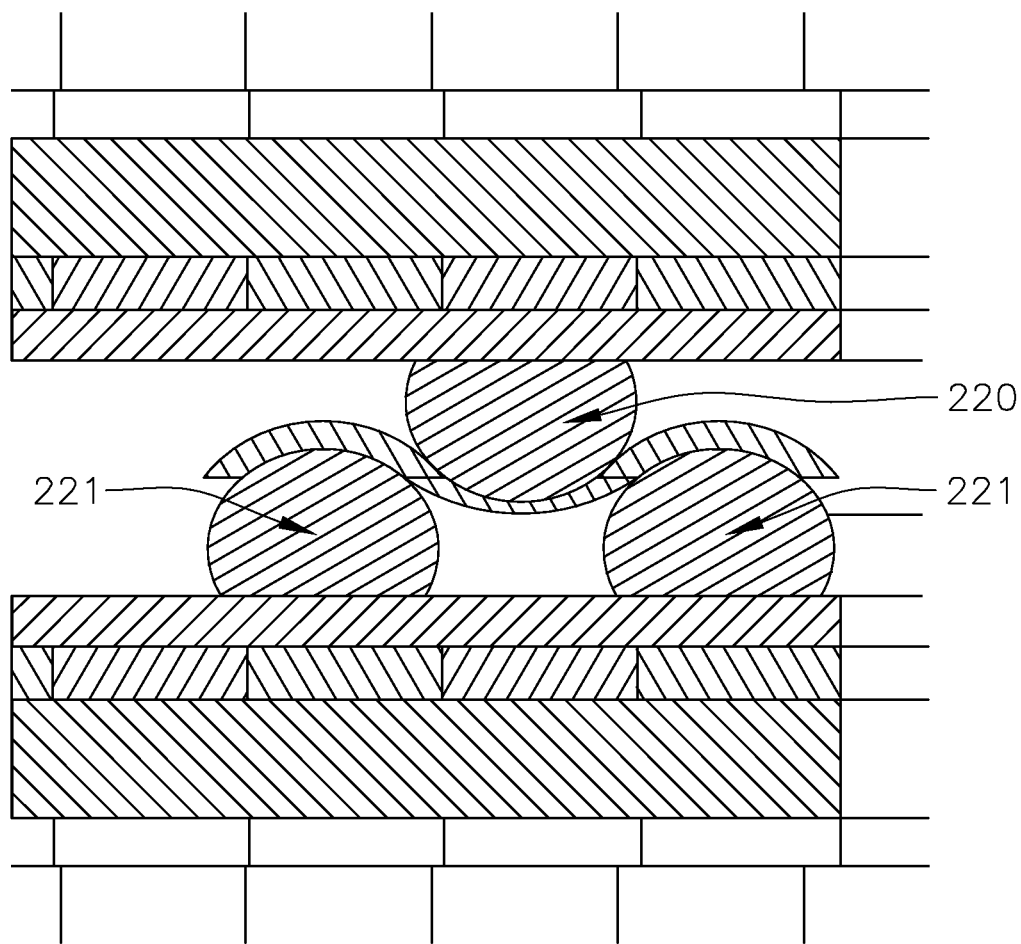
FIG. 3 is a detail view of sacrificial features on a top wafer and a bottom wafer according to another embodiment of the present disclosure.

In the illustrated embodiment, following the task 120 of patterning and selectively etching the second sacrificial layer 218, 219 on each of the top die 201 and the bottom wafer/die 202, the first pattern of projections 220 on the top die 201 is a sawtooth pattern of pillars or wedges, and the second pattern of projections 221 on the bottom wafer/die 202 is a sawtooth pattern of pillars or wedges configured to mate or mesh with the sawtooth pattern of pillars or wedges on the top die 201. Additionally, in the illustrated embodiment, the patterns of pillars or wedges 220, 221 on the top and bottom dies/wafers 201, 202 are configured (e.g., sized and arranged) such that the pillars 220 on the top die 201 are configured to extend into spaces 222 between pairs of adjacent pillars 221 on the bottom wafer/die 202. Accordingly, in the illustrated embodiment, the first pattern of projections 220 are male projections and the second pattern of projections 221 are female projections configured to receive or accommodate the male projections 220. In one or more embodiments, the second pattern of projections 221 may be male projections and the first pattern of projections 220 may be female projections defining spaces or voids configured to receive or accommodate the male projections. In the illustrated embodiment, the configuration (e.g., shape and size) of the pillars 220 on the top die 201 is equal or substantially equal to the configuration (e.g., shape and size) of the spaces 222 between adjacent pillars 221 on the bottom wafer/die 202. Although in the illustrated embodiment, the number of projections 220 on the top die 201 is less than the number of projections 221 on the bottom wafer/die 202, in one or more embodiments, the number of projections 220 on the top die 201 may be greater than the number of projections 221 on the bottom wafer/die 202. In one or more embodiments, the surface area and volume of the first pattern of projections 220 is equal or substantially equal to the surface area and volume of the second pattern of projections 221, which is configured to prevent or at least mitigate deflection or movement of the top die 201 relative to the bottom wafer/die 202 during subsequent tasks of the method 100, which might otherwise result in lateral misalignment between the interconnects 203, 205 of the top and bottom wafers/dies 201, 202. Although in the illustrated embodiment, the projections in the first pattern of projections 220 and the second pattern of projections 221 each have a trapezoidal cross-sectional shape (tapering between a wider end proximate to the first sacrificial layers 216, 217 and a narrower end distal to the first sacrificial layers 216, 217), in one or more embodiments, the projections in the first pattern of projections 220 and the second pattern of projections 221 may have any other suitable cross-sectional shape. For instance, in the embodiment illustrated in FIG. 3, the projections in the first pattern of projections 220 and the second pattern of projections 221 each have a round cross-sectional shape.

As described in more detail below, the mating engagement between the first pattern of projections 220 on the top dies 201 and the second pattern of projections 221 on the bottom wafer/die 202 (e.g., the male-to-female coupling of the first and second patterns of projections 220, 221) is configured to ensure alignment between the interconnects 203 on top die 201 and the corresponding interconnects 205 on the bottom wafer/die 202. In one or more embodiments, the pattern applied to the second sacrificial layer 218 of the top die 201 during the task 120 (which is utilized to perform the selective etch of the second sacrificial layer 218) is aligned with respect to the interconnects 203 of the top die 201, and the pattern applied to the second sacrificial layer 219 of the bottom wafer/die 202 during the task 120 (which is utilized to perform the selective etch of the second sacrificial layer 219) is aligned with respect to the interconnects 204 of the bottom wafer/die 202 (i.e., the patterns are aligned with respect to the interconnects 203, 204 of the wafer/die 201, 202 to which the pattern is applied). Aligning the patterns to the respective interconnects 203, 204 is configured to reduce the alignment error between interconnects 203, 204 of the top and bottom wafers/dies 201, 202, when bonded together in a subsequent task, to the approximately nanometer (nm) range.

Figure 2E:
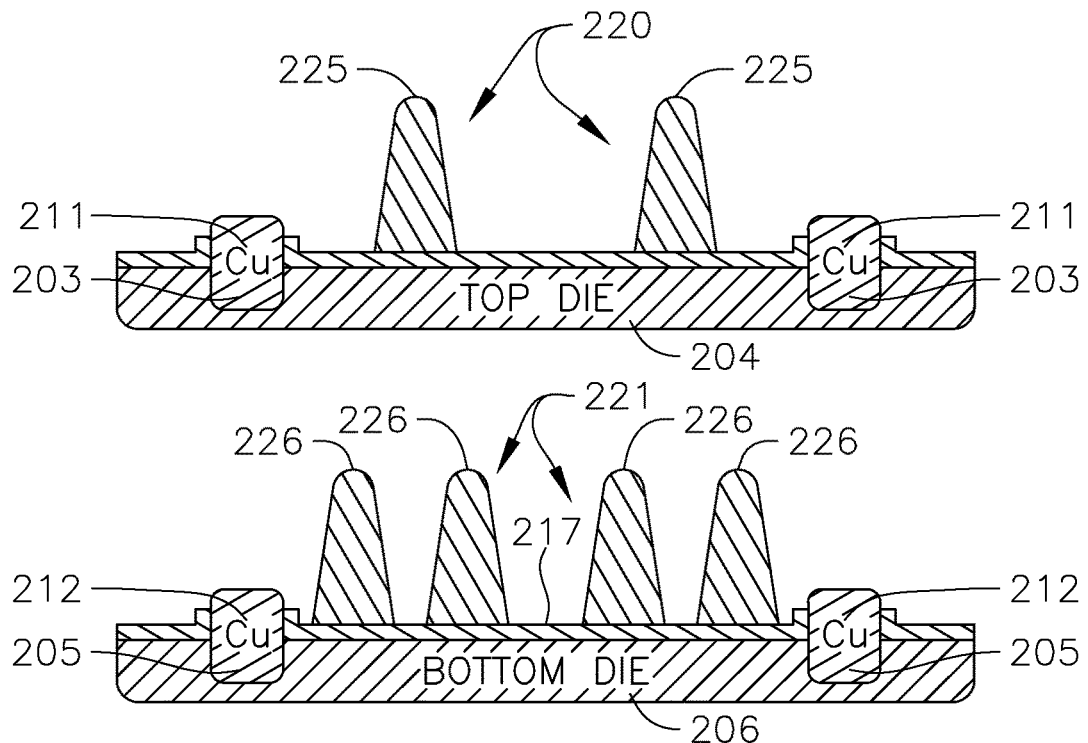

With reference now to the embodiment illustrated in FIGS. 1 and 2E, the method 100 includes a task 125 of performing a low-temperature anneal of the first and second patterns of projections 220, 221 on the top and bottom wafers/dies 201, 202 to smooth (e.g., round) sharp edges 223, 224 of the projections 220, 221, respectively, into smooth (e.g., round) edges 225, 226, respectively. In one or more embodiments, the task 125 of performing the low-temperature anneal of the first and second patterns of projections 220, 221 smooths (e.g., rounds) the sharp edges 223, 224 of the projections 220, 221 into the smooth (e.g., round) edges 225, 226, respectively, by causing a reflow of the first and second patterns of projections 220, 221. In one or more embodiments, the anneal may be performed at a temperature of approximately 500° C. or less. In one or more embodiments, the anneal may be performed for a sufficiently long duration to smooth (e.g., round) the sharp edges 223, 224 of the projections 220, 221, but also a sufficiently short duration that the throughput requirements of the projections 220, 221 are achieved (e.g., the anneal may be performed for a duration sufficient to smooth the sharp edges 223, 224 of the projections 220, 221 while also maintaining the desired volume of the projections 220, 221). In one or more embodiments, the anneal may be performed for a duration in a range of approximately 1 min to approximately 100 min. In one or more embodiments, the anneal may be performed for a duration in a range of approximately 1 min to approximately 20 min. In one or more embodiments, the anneal may be performed at a temperature of approximately 400° C. or less. Additionally, in one or more embodiments, the anneal may be performed with hydrogen or hydrogen plasma. Suitable techniques for performing task 125 are described in Jung-Hoon Lee et al., "Low-pressure, low-temperature hydrogen annealing for nanoscale silicon fin rounding," 2006 IEEE Nanotechnology Materials and Devices Conference, 2006, vol. 1, pp. 638-639, the entire contents of which are incorporated herein by reference. Smoothing (e.g., rounding) the sharp edges 223, 224 of the projections 220, 221 is configured to mitigate against the generation of elevated stress regions (e.g., stress risers) between the first pattern of projections 220 on the top die 201 and the second pattern of projections 221 on the bottom wafer/die 202 when the first and second patterns of projections 220, 221 engage each other during the performance of lateral and vertical movements to align the top and bottom wafers/dies 201, 202, as described below in a subsequent task of the method 100.

Figure 2F:
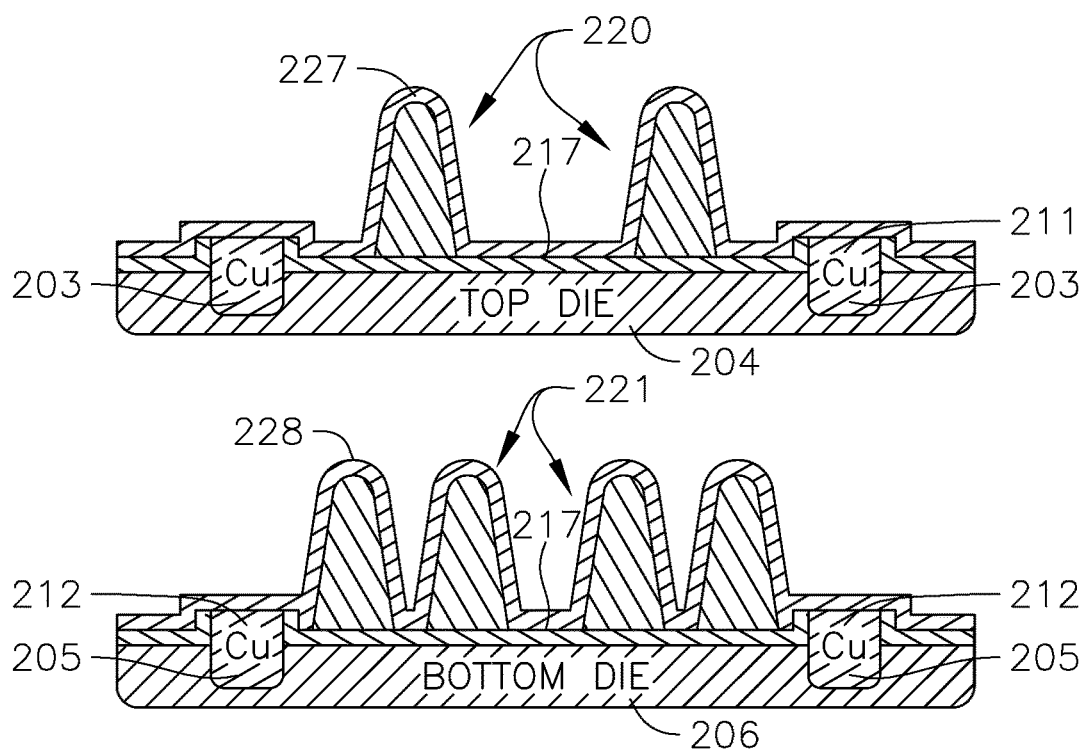

With reference now to the embodiment illustrated in FIGS. 1 and 2F, the method 100 includes a task 130 of applying a lubricant layer 227, 228 to exposed surfaces of the projections 220, 221 on the top and bottom wafers/dies 201, 202, respectively. In one or more embodiments, the lubricant layer may be applied only to the projections 220 or to the projections 221. The lubricant layer 227, 228 may include any suitable lubricant, such as amorphous-carbon (aC), graphite, graphene, or boron nitride. In one or more embodiments, a thickness of each the lubricant layers 227, 228 may be in a range of approximately 1 nm to approximately 20 nm. In one or more embodiments, a thickness of each the lubricant layers 227, 228 may be in a range of approximately 1 nm to approximately 5 nm. The lubricant layers 227, 228 are configured to reduce friction between the first and second patterns of projections 220, 221 on the top and bottom wafers/dies 201, 202, and thereby promote smooth guiding and gliding between the first and second patterns of projections 220, 221, during a subsequent task of performing lateral and vertical movements to align the top and bottom wafers/dies 201, 202. Additionally, in one or more embodiments, the smooth (e.g., rounded) edges 225, 226 of the projections 220, 221 achieved following task 125 further enable the lubricant layers 227, 228 to function as a nano-lubricant to reduce friction between the first and second patterns of projections 220, 221 on the top and bottom wafers/dies 201, 202.

Figure 2G:
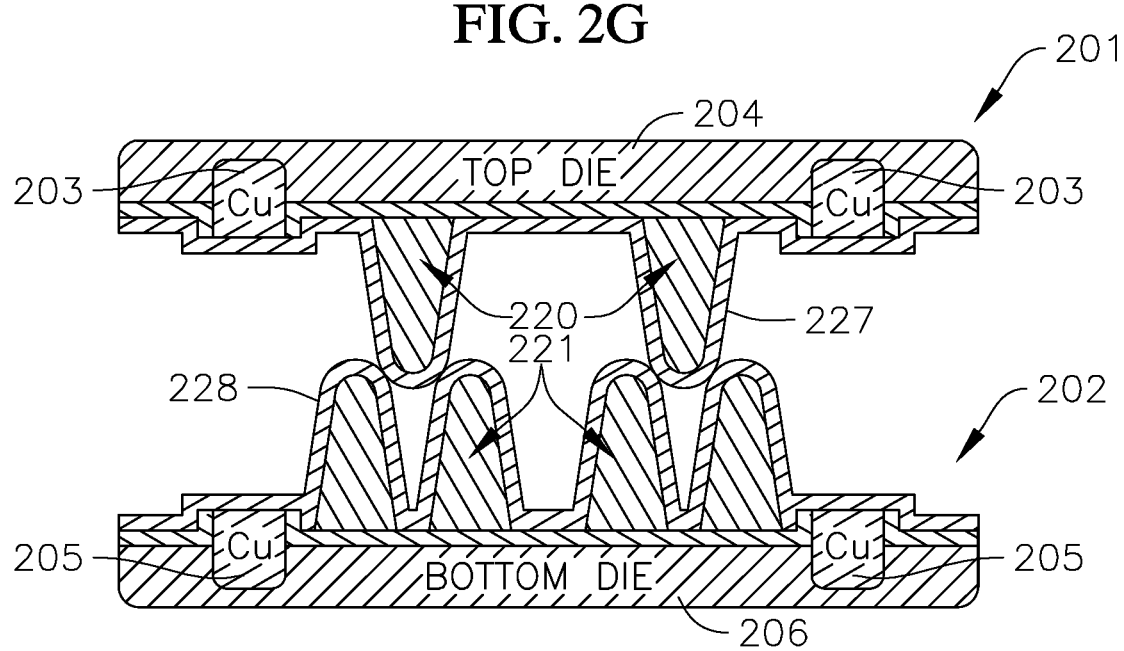

With reference now to the embodiment illustrated in FIGS. 1 and 2G, the method 100 includes a task 135 of dicing the top wafer into a series of top dies, and then flipping the top dies 201 and positioning or placing them on top of the bottom wafer 202 (to form a series of die-to-wafer (D2W) 3D semiconductor devices), or dicing the top and bottom wafers into a series of top and bottom dies, and then flipping the top dies 201 and placing them on top of the respective bottom die 202 (to form a series of die-to-die (D2D) 3D semiconductor devices). The task 135 also includes performing a preliminary alignment of the top dies 201 with the bottom dies 202 (or the top dies 201 with the bottom wafer 202) utilizing robotics such that alignment in the range of approximately 1 um to approximately 5 um is achieved between the interconnects 203, 204 of the top dies 201 and the bottom dies 202 (or the top dies 201 and the bottom wafer 202). In one or more embodiments, the cross-sectional area of the second sacrificial layer 218, 219 on each of the top and bottom wafers/dies 201, 202 is sufficient such that the first pattern of protrusions 220 and the second pattern of protrusions 221 do not plastically deform when the top die 201 is stacked on the bottom wafer/die 202 in task 130. In one or more embodiments, the cross-sectional area of the second sacrificial layer 218, 219 on each of the top die 201 and the bottom wafer/die 202 is in range from approximately 0.1 um×approximately 0.5 um to approximately 1 um×approximately 50 um. In one or more embodiments, the cross-sectional area of the second sacrificial layer 218, 219 on each of the top die 201 and the bottom wafer/die 202 is in range from approximately 0.1 um×approximately 0.5 um to approximately 0.1 um×approximately 5 um.

Figure 2H:
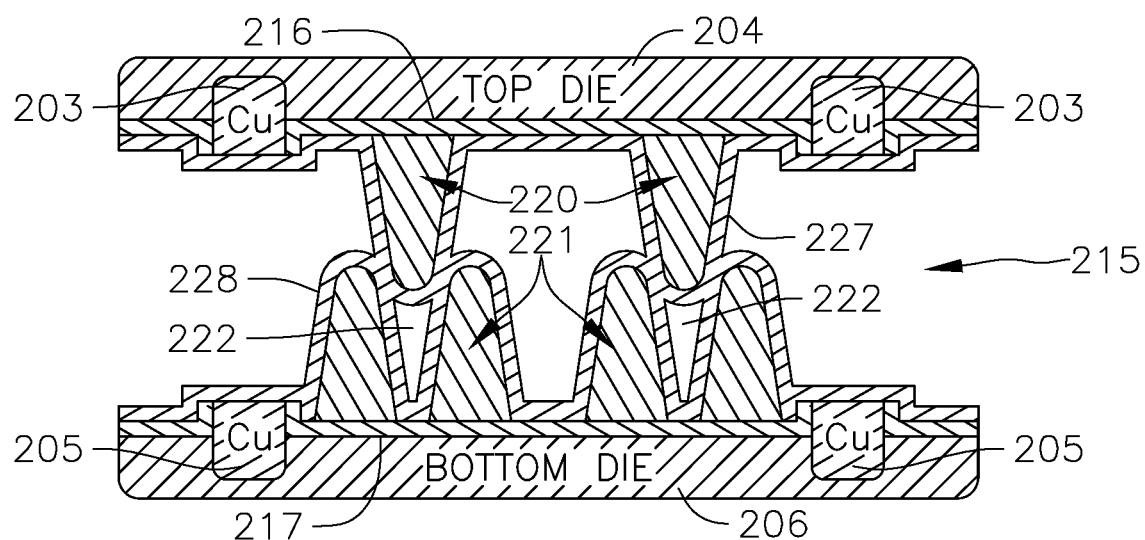

With reference now to the embodiment illustrated in FIGS. 1 and 2H, the method 100 includes a task 140 of releasing the top dies 201 onto the bottom wafer 202 (or the bottom dies 202) such that the first pattern of projections 220 on the top dies 201 engage the second pattern of projections 221 on the bottom wafer 202 (or the bottom dies 202) such that the top dies 201 glide and/or slide onto the bottom wafer 202 (or the bottom dies 202). In one or more embodiments, the matching or corresponding configurations (e.g., shape, size, and arrangement) of the first and second patterns of projections 220, 221, the relatively high mechanical strength of the projections 220, 221 (e.g., a Young's modulus of approximately 110 MPa for projections 220, 221 formed of Ge), the smoothed (e.g., rounded) corners 225, 226 of the projections 220, 221 (achieved following task 125 of annealing the projections 220, 221), and the lubricant layers 227, 228 on the projections 220, 221 are configured to guide and glide the first and second patterns of projections 220, 221 into mated or enmeshed engagement with each other, as shown for example in FIG. 2H. In this manner, the interconnects 203 of the top dies 201 are self-aligned with the interconnects 204 of the bottom wafer 202 (or the bottom dies 202), and the alignment error is reduced from an initial misalignment in a range approximately 1 um to approximately 5 um following the task 130 of positioning the dies/wafer 201, 202 utilizing robotics, to a final misalignment of less than approximately 1 um (e.g., less than approximately 200 nm).

Figure 2I:
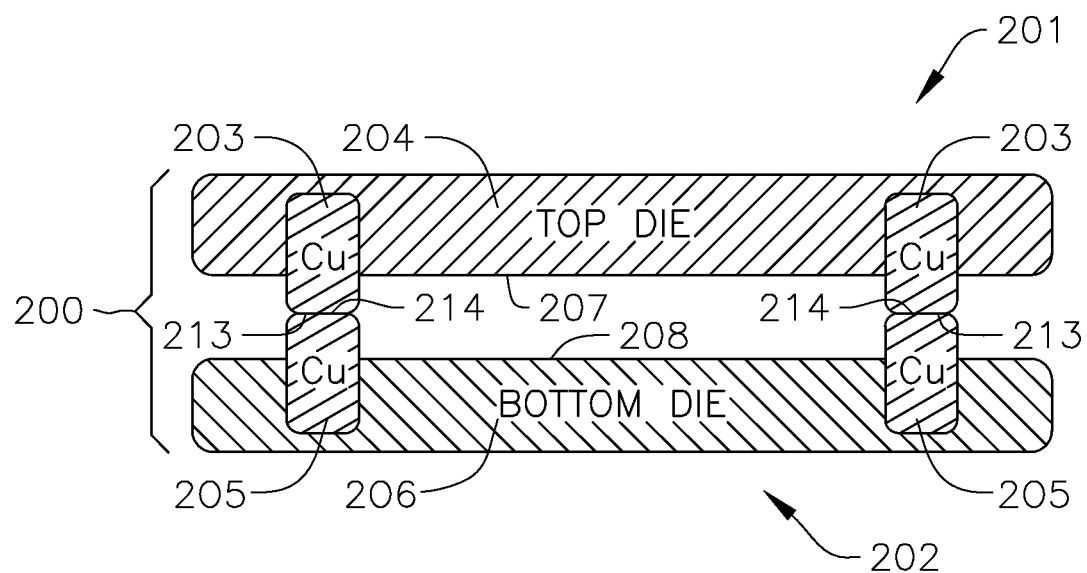

With reference now to the embodiment illustrated in FIGS. 1 and 2I, the method 100 includes a task 145 of performing one or more selective etches to remove the lubricant layers 227, 228, the first and second patterns of projections 220, 221 formed from the second sacrificial layer 218, 219, and the first sacrificial layer 216, 217. In one or more embodiments, the etch rate selectivity of the lubricant layers 227, 228 are at least approximately 20 times higher than the dielectric material of the dielectric substrate and the material of the interconnects 203, 204. In one or more embodiments, the etch rate selectivity of the lubricant layers 227, 228 relative to the dielectric substrate and the interconnects 203, 204 may be approximately 20 or more (i.e., the etch rate of the lubricant layers 227, 228 may be at least 20 times higher than the etch rate of the dielectric material of the dielectric substrate 204, 206 and the material of the interconnects 203, 204). In one or more embodiments, the etch rate selectivity of the lubricant layers 227, 228 relative to the dielectric substrate 204, 206 and the interconnects 203, 204 may be approximately 50 or more. In one or more embodiments, the etch rate selectivity of the lubricant layers 227, 228 relative to the dielectric substrate 204, 206 and the interconnects 203, 204 may be approximately 100 or more. The task 145 of selectively etching the lubricant layers 227, 228, the first and second patterns of projections 220, 221 formed from the second sacrificial layer 218, 219, and the first sacrificial layer 216, 217 may be performed utilizing any suitable etching technique, such as a wet etch, a dry plasma etch, or an atomic layer etch.

Following the task 145 of performing the one or more sacrificial etches, the interconnects 203 of the top dies 201 are in contact (e.g., direct contact) with the interconnects 204 of the bottom wafer 202 (or the bottom dies 202 if the bottom wafer was diced in a preceding task), as illustrated in FIG. 2I. The task 145 of performing the one or more sacrificial etches is configured to retain the alignment accuracy between the interconnects 203, 204 achieved following task 140 depicted in FIG. 2H. The heights H of the exposed portions 211, 212 of the interconnects 203, 204 (e.g., heights H in a range from approximately 10 nm to approximately 100 nm) provide sufficient space between the top dies 201 and the bottom wafer 202 (or the bottom dies 202) to perform the one or more sacrificial etches in task 145 to remove the lubricant layers 227, 228, the first and second patterns of projections 220, 221 formed from the second sacrificial layer 218, 219, and the first sacrificial layer 216, 217.

Following the task 145 of performing one or more sacrificial etches to remove the lubricant layers 227, 228, the first and second patterns of projections 220, 221 formed from the second sacrificial layer 218, 219, and the first sacrificial layer 216, 217, the method 100 includes a task 150 of coupling the interconnects 203 of the top dies 201 to the interconnects 204 of the bottom wafer 202 (or the bottom dies 202) utilizing hybrid bonding to complete formation of the 3D semiconductor device 200.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A method of manufacturing a three-dimensional semiconductor device, the method comprising:
    forming a bi-layer sacrificial stack on each of a top wafer and a bottom wafer each comprising a plurality of interconnects in a dielectric substrate, the bi-layer sacrificial stack comprising a first sacrificial layer and a second sacrificial layer on the first sacrificial layer;
    selectively etching the second sacrificial layer on each of the top wafer and the bottom wafer, the selectively etching of the sacrificial layer forming a first pattern of projections on the top wafer and a second pattern of projections on the bottom wafer, wherein the first pattern of projections is configured to mesh with the second pattern of projections;
    positioning the top wafer on the bottom wafer and releasing the top wafer such that engagement between the first pattern of projections and the second pattern of projections self-aligns the plurality of interconnects of the top wafer with the plurality of interconnects of the bottom wafer within a misalignment error; and
    selectively removing the first and second patterns of projections and the first sacrificial layer, wherein following the selectively removing, the plurality of interconnects of the top wafer are in contact with the plurality of interconnects of the bottom wafer.

2. The method of claim 1, further comprising forming a lubricant layer on at least one of the first pattern of projections and the second pattern of projections.

3. The method of claim 1, wherein each of the first pattern of projections and the second pattern of projections comprises a sawtooth pattern of tapered pillars.

4. The method of claim 1, wherein the first pattern of projections defines a plurality of male features, and the second pattern of projections defines a plurality of female features configured to receive the plurality of male features.

5. The method of claim 1, wherein the misalignment error is less than approximately 1 um.

6. The method of claim 1, further comprising annealing each of the first pattern of projections and the second pattern of projections, wherein the annealing smooths sharp edges of each of the first pattern of projections and the second pattern of projections.

7. The method of claim 6, wherein the annealing is performed with hydrogen or hydrogen plasma at a temperature of approximately 400° C. or less.

8. The method of claim 1, further comprising selectively etching the dielectric substrate, wherein the selectively etching the dielectric substrate exposes exposed portions of the interconnects.

9. The method of claim 8, wherein a height of each of the exposed portions of the interconnects is in a range from approximately 10 nm to approximately 100 nm.

10. The method of claim 1, wherein a material of the plurality of interconnects comprises copper, and wherein a material of the dielectric substrate comprises silicon dioxide.

11. The method of claim 1, wherein a material of the first sacrificial layer is selected from the group of materials consisting of silicon oxycarbide (SiCO), silicon nitride ($Si_3N_4$), silicon-oxynitride (SiON), silicon carbide (SiC), silicon carbon nitride (SiCN), silicon carbon oxynitride (SiCON), aluminum (Al), cobalt (Co), and a silicon-germanium (SiGe) alloy.

12. The method of claim 1, wherein a material of the second sacrificial layer comprises germanium or a germanium-aluminum alloy.

13. The method of claim 2, wherein a material of the lubricant layer is selected from the group consisting of amorphous-carbon (aC), graphite, graphene, and boron nitride.

14. The method of claim 1, wherein a thickness of the second sacrificial layer is greater than a thickness of the first sacrificial layer.

15. The method of claim 14, wherein the thickness of the second sacrificial layer is in a range from approximately 50 nm to approximately 1,000 nm, and wherein the thickness of the first sacrificial layer is in a range from approximately 1 nm to approximately 100 nm.

16. The method of claim 1, wherein a cross-sectional area of the second sacrificial layer on the top wafer is substantially equal to a cross-sectional area of the second sacrificial layer on the bottom wafer.

17. The method of claim 16, wherein the cross-sectional area of the second sacrificial layer has a length and a width in a range from approximately 0.1 um×approximately 0.5 um to approximately 0.1 um to approximately 5 um.

18. A method of manufacturing a three-dimensional semiconductor device, the method comprising:
    forming a bi-layer sacrificial stack on each of a top wafer and a bottom wafer each comprising a plurality of interconnects in a dielectric substrate, the bi-layer sacrificial stack comprising a first sacrificial layer and a second sacrificial layer on the first sacrificial layer;
    forming a first pattern of projections from the second sacrificial layer on the top wafer and a forming second pattern of projections on the second sacrificial layer on the bottom wafer, wherein the first pattern of projections is configured to mesh with the second pattern of projections;
    forming a lubricant layer on each of the first pattern of projections and the second pattern of projections;
    positioning the top wafer on the bottom wafer with a robotic device such that the plurality of interconnects of the top wafer are aligned with the plurality of interconnects of the bottom wafer within a first alignment error;
    releasing the top wafer such that engagement between the first pattern of projections and the second pattern of projections self-aligns the plurality of interconnects of the top wafer with the plurality of interconnects of the bottom wafer within a second alignment error less than the first alignment error; and
    selectively removing the lubricant layer, the first and second patterns of projections, and the first sacrificial layer, wherein following the selectively removing, the plurality of interconnects of the top wafer are in contact with the plurality of interconnects of the bottom wafer.

19. The method of claim 18, wherein the second alignment error is less than approximately 1 μm or less than approximately 200 nm.

* * * * *